United States Patent
Araujo et al.

(10) Patent No.: US 7,891,669 B2
(45) Date of Patent: Feb. 22, 2011

(54) PISTON RING WITH CHROMIUM NITRIDE COATING FOR INTERNAL COMBUSTION ENGINES

(75) Inventors: Juliano Avelar Araujo, Sao Paulo (BR); Gisela Ablas Marques, Sao Paulo (BR); Jose Valentim Lima Sarabanda, Rugby (GB); Robert Richard Banfield, Sao Paulo (BR)

(73) Assignees: Mahle International GmbH, Stuttgart (DE); Mahle Metal Leve S.A., Sao Paolo, SP (BR)

( * ) Notice: Subject to any disclaimer, the term of this patent is extended or adjusted under 35 U.S.C. 154(b) by 461 days.

(21) Appl. No.: 11/919,004

(22) PCT Filed: Jun. 16, 2007

(86) PCT No.: PCT/EP2007/005312
§ 371 (c)(1),
(2), (4) Date: Jan. 16, 2008

(87) PCT Pub. No.: WO2007/147532
PCT Pub. Date: Dec. 27, 2007

(65) Prior Publication Data
US 2009/0278320 A1 Nov. 12, 2009

(51) Int. Cl.
*F16J 9/26* (2006.01)
(52) U.S. Cl. .............. 277/442; 204/192.15; 204/192.16; 428/336; 428/469; 428/472; 428/698
(58) Field of Classification Search .............. 277/442, 277/244; 428/336, 698, 701, 469, 472; 204/192.15, 204/192.16
See application file for complete search history.

(56) References Cited

U.S. PATENT DOCUMENTS

| | | | | |
|---|---|---|---|---|
| 5,160,537 A | * | 11/1992 | Terrat et al. | 106/36 |
| 5,376,188 A | * | 12/1994 | Tahara et al. | 427/248.1 |
| 5,449,547 A | * | 9/1995 | Miyazaki et al. | 428/698 |

(Continued)

FOREIGN PATENT DOCUMENTS

GB  2 276 176  9/1994

(Continued)

OTHER PUBLICATIONS

Chen et al "Microhardness and corrosion behavior in CrN/elctroless Ni/mild steel complex coating" Surface and Coatings Techn. 150 (2002) pp. 239-245.*

(Continued)

*Primary Examiner*—Archene Turner
(74) *Attorney, Agent, or Firm*—Collard & Roe, P.C.

(57) ABSTRACT

The invention relates to a piston ring for internal combustion engines, the piston ring comprises a steel or cast iron base material with a coating of chromium nitride deposited by a physical vapor deposition process on a sliding surface of the piston ring, wherein the coating is composed of a columnar crystal structure of CrN with the following features:
(a) an oxygen content in solid solution of 0.5 to 2.5 wt %;
(b) a content of uniformly dispersed micro-pores of less than 10% in volume of the coating; and
(c) an X-ray diffraction intensity ratio of (111) planes to (200) planes parallel to the surface in the range of 0.80 to 1.20.

8 Claims, 2 Drawing Sheets

U.S. PATENT DOCUMENTS

| | | | |
|---|---|---|---|
| 5,582,414 A * | 12/1996 | Miyazaki et al. | 428/472 |
| 5,743,536 A | 4/1998 | Komuro et al. | |
| 5,851,659 A * | 12/1998 | Komuro et al. | 428/336 |
| 6,149,162 A | 11/2000 | Tanaka et al. | |
| 6,372,369 B1 * | 4/2002 | Ito et al. | 428/698 |
| 6,494,461 B1 * | 12/2002 | Ogawa et al. | 277/442 |
| 6,631,907 B1 * | 10/2003 | Onoda et al. | 277/443 |
| 2006/0269790 A1 | 11/2006 | Sarabanda et al. | |

FOREIGN PATENT DOCUMENTS

WO    WO 2006/131801    12/2006

OTHER PUBLICATIONS

Mattox, "Handbook of Physical Vapor Deposition (PVD) Processing," Noyes Ed., 1998, p. 486. (Spec, p. 2).

International Search Report.

\* cited by examiner

PISTON RING WITH CHROMIUM NITRIDE COATING FOR INTERNAL COMBUSTION ENGINES

CROSS REFERENCE TO RELATED APPLICATIONS

Applicants claim priority under 35 U.S.C. §365 of PCT/EP2007/005312 filed Jun. 16, 2007. The international application under PCT article 21 (2) was filed in English.

BACKGROUND OF THE INVENTION

1. Technical Field of the Invention

The present invention relates to a piston ring for internal combustion engines, comprising a steel or cast iron base material; and a coating of chromium nitride deposited by a physical vapor deposition process on a sliding surface of the piston ring.

2. Description of the Related Art

The use of a chromium nitride film with typical crystal structure of CrN phase on the outer peripheral surface of a piston ring provides high wear resistance for this component. This film is widely used in modern engines, last developments, with high mechanical and thermal loads. Such coating is obtained by physical metallic vapor deposition usually generated by a source of cathodic arc.

However, in some recent engines extremely high loaded or in engines with a high level of combustion pressure, as the ones designed for the next decade, this ceramic coating of chromium nitride presents a intrinsic fragility which takes to the appearance of micro-cracks on its surface. These micro-cracks propagate and their connection takes to a loss of small pieces of the coating, generating damages on its surface and, in some cases, scratches on the engine liners. Not only the scratches but also the damages are usually considered functional failure of the piston rings.

The improvement of resistance to micro-crack generation, which antecedes the loss of material, and the improvement of resistance to scratches on the engine liners is presented in specialized literature through the generation of a chromium nitride film having additions of oxygen, carbon and boron, in solid solution form in the crystalline coating of the CrN phase. The addition of these elements is presented as intrinsically responsible for the resistance increase of micro-cracks.

The change in the crystal structure of a physical vapor deposited film with the addition of small quantities of other reacting gases leads to a change of the properties of this coating, and this is a classic technique established in the literature, for example by Mattox in the Handbook of Physical Vapor Deposition (PVD) Processing, Noyes Ed, page 486. Literature mentions that physical vapor deposited films present columnar crystal morphology with the preferential growth of specific crystal orientations parallel to the surface of the film. The preferred orientation of a specific crystal plane can change the properties of the film and depends on the deposition parameters, such as substrate temperature, addition of reactive gases and ion bombardment.

U.S. Pat. No. 5,743,536 mentions that the crystals of CrN might be predominantly oriented with the (111) dense planes parallel to the surface and that with such orientation there is an improvement of the film peeling. Such predominant orientation was obtained by the manipulation of the deposition parameters, with no external addition of other doping elements to the nitrogen reacting gas. However, it is not mentioned whether or not such orientation is the only one observed, i.e. if preferred orientation means that 100% of the crystal parallel to the surface are of grains with (111) crystal orientation, or in which proportion other crystal orientations are allowed.

Besides, this relatively broad definition regarding the relative content of other crystal planes not so dense as (111) planes, the CrN coating produced with the process described in U.S. Pat. No. 5,743,536 has a relatively low Vickers hardness of 600 to 1000 HV, which would jeopardize the film wear resistance making it not applicable to the recent highly loaded engines.

UK Patent No. GB 2,276,176 describes the doping of CrN with 3 to 20 weight percent of oxygen or, alternatively, the doping of CrN with 2 to 11 weight percent of carbon. The main objective of this was to provide a coating with higher wear and scuffing resistance. The possible crystalline change of CrN coating by the addition of oxygen was not brought into discussion or included in the protection claims of the referred patent document. An X-ray diffraction chart presented in FIG. 6, page 6, only showed that CrN structure has a dominant (200) plane after doping with 10 weight percent of oxygen.

U.S. Pat. No. 6,149,162 describes the deposition of a chromium nitride film with CrN crystal structure having 0.5 to 20 weight percent of oxygen and presenting a microstructure with dominant or preferential orientation of crystal plane (200) parallel to the coating surface. It is mentioned in this patent that a crystal structure of CrN with a preferred orientation of (111) crystal plane is brittle in comparison to the preferred orientation of the (200) crystal plane parallel to the coating surface. In this patent, there was a connection of the oxygen addition to the crystalline coating and the consequent alteration of its crystal structure, giving rise to an improvement of the coating resistance concerning the generation of micro-cracks. However, the definition of preferred orientation is very broad, not allowing the definition of a predominant level, whether or not it means 100% or whether or not allowed a residual level of planes (111) described as brittle is allowed. Likewise, the definition of preferred orientation does not impose criticality to distinct levels of intensity ratio of crystal planes (111) and (200) in the CrN coating. Furthermore, U.S. Pat. No. 6,149,162 depicts that neither a general preferred orientation of less dense (200) crystal planes parallel to the surface nor an addition of 0.5 to 20% of oxygen to a CrN coating with preferred (200) orientation would improve the coating spalling resistance.

Furthermore, it is known that chromium nitride of crystal structure or CrN phase appears in its form established as standardized in nature with intensity ratios between crystal planes (111) and (200), measured by x-ray diffraction, of approximately 0.80. This information is registered on the JCPDS card no. 11-65 (Joint Committee of Powder Diffraction Standards) of the database of composts of ICDD—International Centre for Diffraction Data. Therefore, the presence of a predominant plane must be compared to this intensity ratio of crystal planes of the CrN phase of reference.

International Patent Application No. WO 2006/131801 discloses that the ratio of crystal planes (111) and (200) is limited to a maximum of 0.70 within the trivial deposition parameters and within a proposed oxygen content of 1.0 to 7.0 wt %.

In the above related art technologies, the chromium nitride coating with CrN crystal structure may be configured with a (111) crystal plane preferred orientation, presenting low hardness associated with the deposition parameters used for the obtainment of this orientation, or a (200) crystal plane preferred orientation parallel to the surface, obtained with the addition of a wide range of oxygen. In neither of the above technologies there is a suggestion of a preferred balanced orientation, which allows the presence of both a specific ratio between dense (111) crystal planes and the open structure (200) crystal planes.

OBJECT OF THE INVENTION

It is an object of the present invention to provide a piston ring with a coating of chromium nitride with columnar crystal structure of CrN obtained by a process of physical vapor deposition. This film is characterized by having a superior resistance to the initiation of micro-cracks and to the loss of pieces of the coating, in relation to the prior art CrN coating.

The object of the invention is accomplished by a chromium nitride coating with a CrN crystal structure which is characterized by: 1) Columnar crystal morphology having oxygen content in solid solution in the range of approximately 0.5 to 2.5 percent in weight; 2) Morphology having content of dispersed micro-pores in the coating inferior to 10% in volume; 3) Crystalline orientation defined by the intensity ratio of dense crystal planes (111) to crystal planes (200) parallel to the coated surface between 0.80 to 1.20 and; 4) Vickers Hardness range from 1,500 to 2,500 HV.

The present invention proposes a combined coating composition and process parameters to have a balance between the crystal planes (111) and (200) with superior spalling resistance.

Such objective is achieved by the control of deposition parameters in a vacuum chamber for equipment with 750 to 1000 liters of volume capacity with a chamber pressure within 2.5 to $5.0 \times 10^{-2}$ mbar, bias voltage in the range of −15 to −50V and the partial pressure of oxygen in the range of 5.0 to $10.0 \times 10^{-4}$ mbar.

The (200) crystal plane is more open in nature. This opening is defined by the linear density of a given crystal plane which is low for the planes of the family (200). A coating with such plane, oriented parallel to the surface and perpendicular to the film growth direction is able to have higher absorption of internal compressive stresses of the film that develop during the film growth, due to the fact that it has more space among atoms in this crystal plane. However, due to its more open structure, the (200) crystal plane presents a higher degree of difficulty to move dislocations to relieve shearing external stresses applied to the coated surface. Said that, a coating having predominant (200) crystal plane orientation parallel to the surface has, as a consequence, lower fracture tenacity and, consequently, lower surface crack resistance to the external stresses applied. Such compromise of having a relatively higher absorption capacity of internal compressive stress, which is positive to a ceramic coating, with a lower surface crack resistance to external shearing loads, gives an overall balance of the coating out of an optimum performance concerning resistance to generation of micro-cracks on its surface.

On the other hand, a coating having the (111) crystal plane with predominant orientation parallel to the surface develops higher internal stresses. This happens due to the crystal planes' (111) closer atomic nature, i.e., a structure with less space among atoms. This less space among atoms makes the internal stress generated by the coating growth to be higher. On the other hand, there is a higher facility of dislocations through the compact planes, where the (111) plane is the one that presents the highest facility. This dislocation movement facility gives a higher capacity of relieving shearing external stress applied to the coating. A coating having predominant orientation of the dense crystal plane (111) parallel to the surface has, as a consequence, higher fracture tenacity, and consequently, a higher resistance to the initiation of cracks originated by external stress applied. Such compromise is the opposite of the compromise presented when (200) crystal plane orientation is predominant described above, i.e., the predominance of crystal planes (111) parallel to the surface has a lower absorption capacity of internal stress and a higher resistance to the initiation of surface cracks due to external shear stress. In a global way, the performance of a crystalline film with predominance of (111) crystal planes is also far from an optimum performance.

The present invention provides a chromium nitride film of CrN crystal structure able to provide a better compromise between these opposite effects mentioned, i.e., superior balance between internal stress absorption capacity and resistance to the initiation of superficial cracks due to external shearing stress, leading to a superior performance of this coating. Such objective was met by the balance of the relative content of (111) crystal plane and the content of (200) crystal plane on the coating. The content of each crystal plane in the film is given by the counting intensity of the respective crystal plane by x-ray diffraction and the balance between the content of each crystal plane in the coating is given by the counting intensity ratio of each of the two planes. For coating characterization, the counting intensity ratio between crystal planes (111) and (200) was arbitrarily selected for the indication between the content of both crystal planes. The balance is represented by the ratio of the x-ray diffraction counting intensity of (111) to (200) crystal planes parallel to the surface.

This proposal of a balance between crystal planes (111) and (200) and its representation through the ratio between its respective counting intensities obtained by x-ray diffraction is an element which assures besides a better balance among properties of each crystal plane a quantitative definition of the coating crystal structure, being different from a open definition of predominance of a specific crystal plane.

The chromium nitride coating of CrN crystal structure corresponding to the state of the art is obtained from an industrial cathodic arc coating equipment with bias voltage between rings and anode of 0 to − (negative) 100 volts, substrate temperatures of 350 to 500° C., total gas pressures in the range of $5 \times 10^{-5}$ to $10^{-1}$ mbar and no intentional addition of oxygen to the nitrogen reacting gas. On these conditions the chromium nitride film presents a content of residual oxygen up to approximately 0.5 percent in weight. Up to such level of oxygen content the deposited coating has a predominance of the (200) crystal plane parallel to the substrate. Such predominance is represented by an intensity ratio of (111) crystal plane to the (200) crystal plane of 0.20 to 0.35 as shown by the samples 1 and 2 in Table 1.

The definition of predominance of (200) crystal planes in this coating becomes clear when compared with the reference CrN crystal structure on nature represented by the information contained on JCPDS card no. 11-65, which lists a standardized intensity of crystal plane (200) of 100 and a standardized intensity of crystal plane (111) of 80. It calculates, thus, an intensity ratio between crystal plane (111) and crystal plane (200) of 0.80. Therefore, a film presenting an intensity ratio lower than approximately 0.35 is arbitrarily characterized here as having predominance of (200) crystal plane.

A higher addition of oxygen gas to the nitrogen reacting gas led to the formation of CrN coating having 10.4% in weight of oxygen. This coating presented an intensity ratio between crystal plane (111) and crystal plane (200) of 0.13, as exemplified by the coating of sample 3 in Table 1. This coating reflects the state of the technique presented in U.S. Pat. No. 6,149,162, which discloses that an addition of 0.5 to 20.0 in weight of oxygen gives origin to a coating with predominant crystal structure (200). The functional evaluation of such a coating, as presented in example 2, showed insufficient resistance to surface crack generation and consequent localized loss of pieces of the coating.

The present invention features a piston ring with a CrN coating containing oxygen in a solid solution form and with predominance of planes (111) and (200), parallel to the surface, in a similar proportion with incidence of both planes not lower than 80%. FIG. 2 shows a graphic of X-ray diffraction of the CrN coating having similar intensity counting of crystalline planes (111) and (200). The physical vapor deposited (PVD) film of CrN with oxygen included in a solid solution state can be applied by means of an ion plating process which uses metallic chromium target attached to a cathode to generate metallic ions. Argon, nitrogen and oxygen are ionized and used as process gases. Prior to the deposition step, pumps are used to generate a vacuum in the chamber. Moreover, an etching stage takes place inside the vacuum chamber to remove oxides and dirt from the ring's surface improving the bonding of the coating. In order to obtain the desired coating structure and properties an accurate control of deposition parameters in the vacuum chamber, i.e. chamber pressure, bias voltage and partial gas pressure of oxygen, is necessary.

Such objective is for example achieved by the control of deposition parameters in a vacuum chamber for equipment with 750 liters of volume capacity. The total pressure should be within 2.5 to $5.0 \times 10^{-2}$ mbar, the bias voltage within $-15$ to $-50$ V and the partial pressure of oxygen in the range of 5.0 to $10.0 \times 10^{-4}$.

In case of different volume capacity of the equipment, the total pressure should be adjusted.

The following features are achieved when the parameters above are respected:

Intensity ratio of the crystalline planes (111) to (200) within 0.8 and 1.2.

Oxygen at 0.5 to 2.5 percent by weight.

Porosity level up to 10%.

A piston ring with a combination of the above features was found to be more effective in improving resistance to cracks and peeling of the coating, thus, improving engine performance and durability.

Furthermore, the following additional features can be achieved:

Chromium at 70 to 80 percent by weight.

Nitrogen at 20 to 30 percent by weight.

Vickers hardness of 1,500 to 2,500 HV.

Thickness of the film in a range from 5 to 80 microns.

The functional evaluation of the coating samples 4 to 6, presented in Table 1, presents an absence of micro-cracks on their surfaces after a functional test, demonstrating that similar proportion of crystal planes (111) and (200) produce superior performance of the chromium nitride coating.

The state of the art described above, represented by a predominance of crystal planes (200) and oxygen content in the coating in the range of 0.5 to 20.0 percent in weight defines a homogeneous behavior in the functional aspect. The present invention demonstrates that a coating having a specific balance between the incidence of crystal plane (111) and crystal plane (200) presents a superior functional behavior and that only a narrow range, of approximately 0.5 to 2.5 percent in weight of oxygen, is able to provide a coating with a crystal structure according to the present invention.

This crystal structure with an optimized balance between crystal planes (111) and (200) is accomplished, among other things, by the addition of oxygen, and the final oxygen content is within a functional range of approximately 0.5 percent in weight to approximately 2.5 percent in weight. The choice of the oxygen range according to the present invention can be explained by the comparison of the coating of samples 3 and 6, respectively representing the state of the art with 10.4 percent in weight of oxygen in the coating and with intensity ratio between crystal plane (111) and (200) of 0.13 and representing the scope of the present invention with 2.3 percent in weight of oxygen in the coating and with intensity ratio between crystal planes (111) and (200) of 0.98. Likewise, for the lower level of the functional range of oxygen content, the comparison of coating of samples 1 and 4, respectively representing the state of the art with 0.3 percent in weight of oxygen in the coating and with intensity ratio between crystal plane (111) and (200) of 0.25 and representing the scope of the present invention with 1.2 percent in weight of oxygen in the coating and with intensity ratio of crystal plane (111) and (200) of 0.85.

BRIEF DESCRIPTION OF THE DRAWINGS

The present invention will now be described with reference to the attached drawings, in which.

1. Base material in steel or cast iron

2. Optional nitrided case

3. Optional bonding layer

4. Optional intermediate layer

5. Chromium nitride layer

Figure 1:
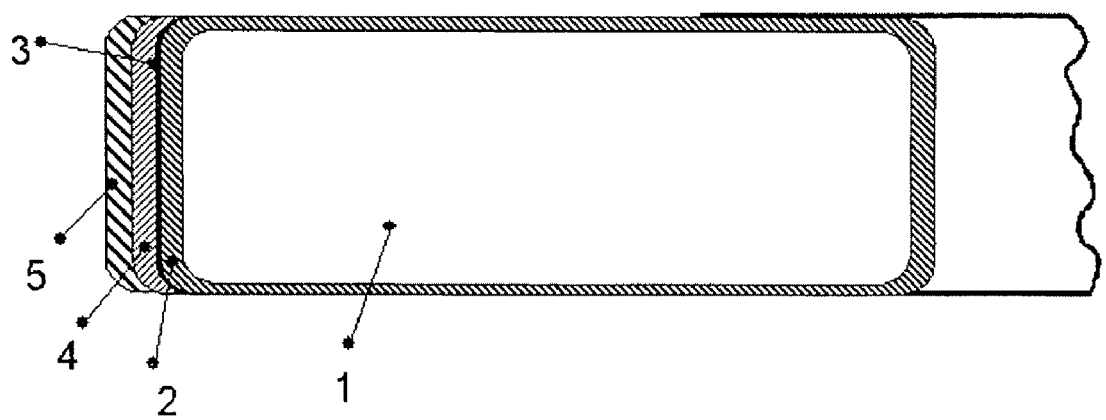
FIG. 1 illustrates a cross section of a piston ring showing base material and the possible layers described in the embodiments of the present invention, as follows.
Figure 2:
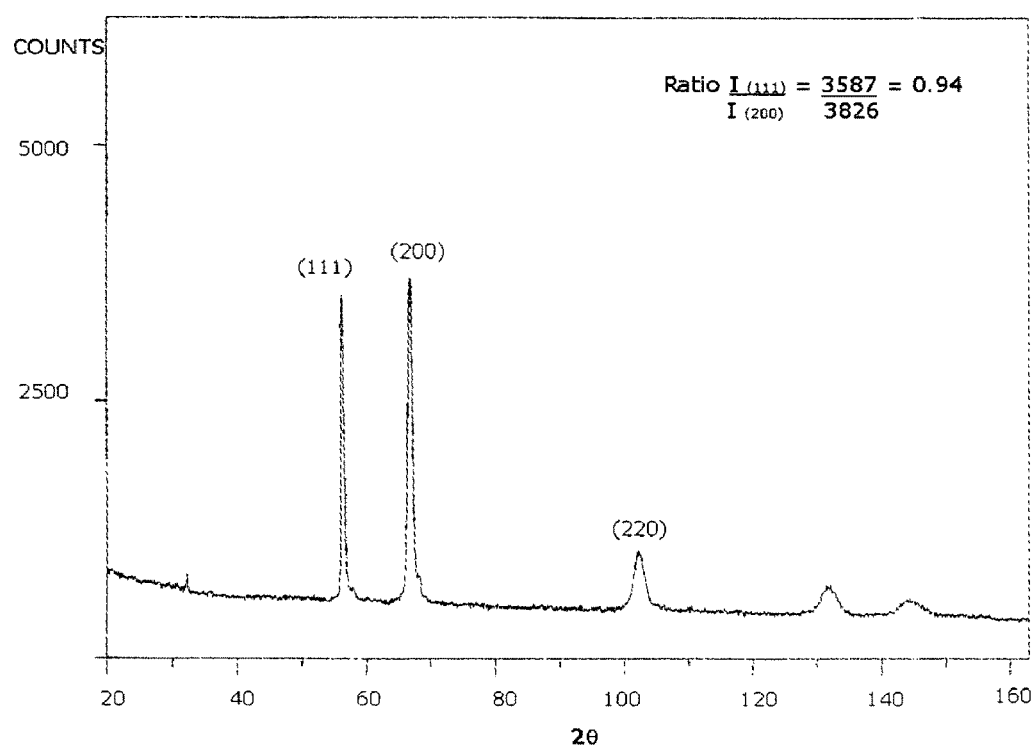

FIG. 2 shows the X-ray diffraction pattern obtained with Cu tube of the CrN coating with external addition of oxygen, and having similar intensity counting of crystalline planes (111) and (200) as described in the embodiments of the invention.

Figure 3:
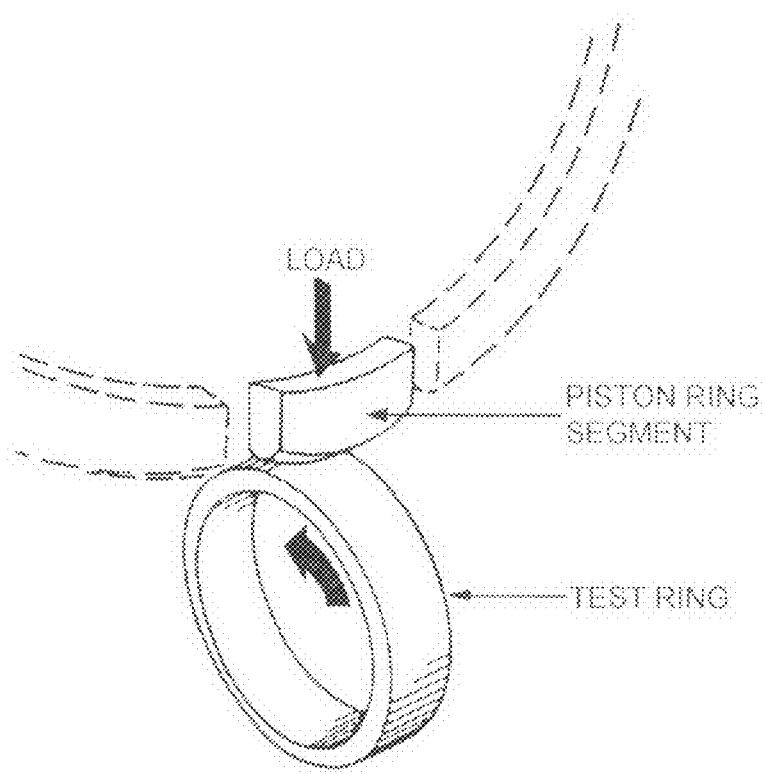

FIG. 3 illustrates a schematic diagram of the tribological system used for the bench test evaluation.

Figure 4:
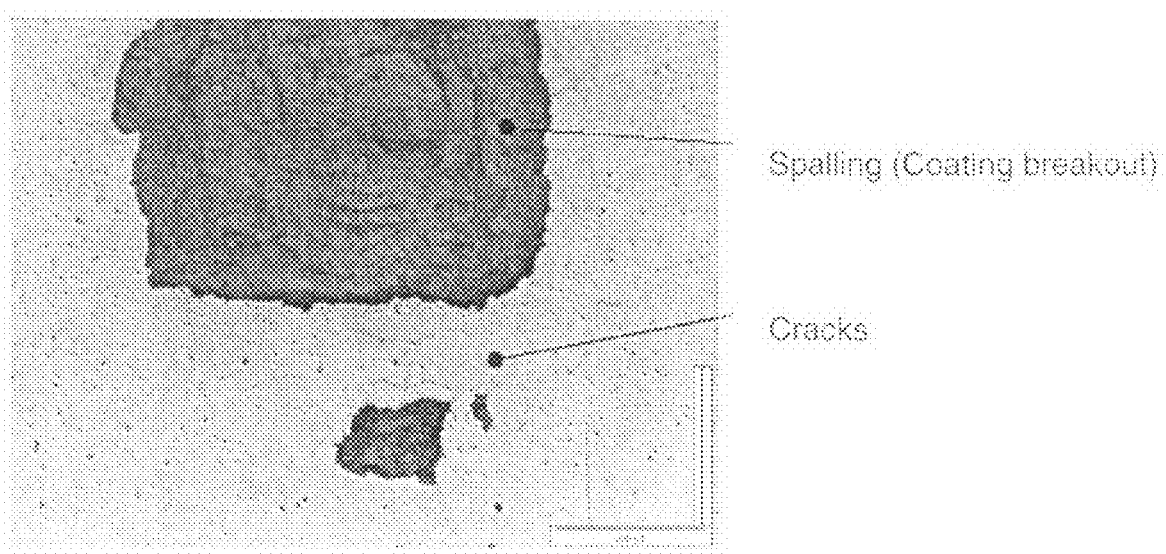

FIG. 4 shows the running face of a piston ring with a CrN coating of the prior art after heavy duty diesel engine operation with occurrence of cracks and spalling.

DESCRIPTION OF THE PREFERRED EMBODIMENTS

Following are described some examples of execution of the scope of the presented invention, as well as the functional evaluation of these examples in comparison with the executions that reproduce the state of the art.

Piston ring prototypes with having a diameter of 128 mm, a height of 3.0 mm, a radial width of 4.6 mm, for a 450 kW heavy duty Diesel engine, and piston rings having a diameter of 137 mm, a height of 3.0 mm and a radial width of 4.1 mm, for a 400 kW heavy duty Diesel engine, were manufactured onto martensitic stainless steel having 17% Cr, optionally nitrided, ground on its external face, degreased and assembled in appropriate fixtures to receive on its peripheral external face a chromium nitride coating having a CrN crystal structure. This coating was deposited in a vacuum process by physical vapor generated by industrial cathodic arc equipment—HTC750 Hauzer coater.

After the execution of vacuum in the chamber until a pressure of approximately $5 \times 10^{-5}$ mbar, the parts were heated up to 450° C. In the sequence, Argon gas was introduced in a controlled flow, stabilizing the pressure in the vacuum chamber, with the objective of performing an ion etching with Bias voltage between the rings and the anode of − (minus) 900 V. After the ion etching, nitrogen gas was introduced in the chamber with a controlled flow, stabilizing the chamber pressure between values of $2.5 \times 10^{-2}$ to $4.0 \times 10^{-2}$ mbar. For the deposition of the chromium nitride coating having oxygen, a controlled mixture of oxygen and nitrogen gas was introduced in the vacuum chamber with a controlled flow stabilizing the chamber pressure between of $2.5 \times 10^{-2}$ to $5.0 \times 10^{-2}$ mbar. The deposition took place with a cathodic current of 220 A and voltage between the rings and the cathode between −15 to −50 V. After deposition, the parts were cooled down to 220° C., before the vacuum chamber was vented.

The coating samples 4 to 6 in Table 1 have intentional addition of oxygen in the range of 0.5 to 2.5 percent in weight, and the total pressure and the bias voltage applied are described in Table 1.

The coating samples 1 and 2 represent the chromium nitride execution as the industrial application with no intentional addition of oxygen. The coating sample 3 represents the chromium nitride execution as the industrial application with intentional addition of oxygen. Table 1 presents the intensity ratios of crystal planes (111) to (200) of all the samples produced. The following examples will evaluate the functionality in engine tests of some of these samples.

In Table 1 are described comparative examples selected from the prior art and examples within the scope of the present invention with the respective processing parameters and metallurgical properties for each coating. The coatings were evaluated by means of different analysis methods. The crystal structure and respective planes were determined by X-ray diffraction. Porosity and thickness were measured by image analysis in a polished cross section with 500 times magnification. Hardness evaluation was performed by means of a Leica Micro hardness tester on the polished cross section. Chemical analysis was performed by X-ray microanalysis in a scanning electron microscope.

Example 1

With the above-mentioned method, piston rings were produced represented by sample coating 4 on Table 1. Three rings of this condition were assembled in a heavy duty Diesel engine (6 cylinders 450 kW). The rings were submitted to an accelerated thermal shock test in a dynamometer cell for 500 hours, where the liner and block thermal deformation conditions, besides severe conditions regarding oil film rupture, are particularly keen to the generation of high load on the coated surface of the piston rings. Visual and metallurgical evaluation of the rings after the test was conducted and can be seen on Table 2, test 1.

Table 2 also indicates the assembling configuration of the compression rings in the six cylinders of the engine. The cylinder liners as well as the second ring and the oil ring were taken from the same production lots to minimize as much as possible the variables involved.

The rings of coating sample 1 in Table 1 represent the state of the art, and they have residual oxygen content in the coating that was not originated from any intentional addition of oxygen. This coating presents predominance of (200) crystal plane oriented parallel to the coating surface, and has intensity ratio between (111) and (200) crystal planes of 0.30. After the engine test these rings presented incidence of micro-cracks on the coating and localized loss of pieces of the coating, being a reference for the evaluation of the coatings having oxygen contents not originated by intentional addition.

The results allow to conclude that a chromium nitride coating with CrN structure having oxygen content inferior to approximately 0.5 percent in weight, characterized by predominance of crystal plane (200) parallel to the coating surface and having intensity ratio between crystal plane (111) and (200) lower than approximately 0.30, present incidence of micro-cracks in the engine test described above.

Visual and metallurgical evaluation of the rings after the test was conducted and can also be seen on Table 2.

Example 2

With the above-mentioned method, piston rings were produced represented by sample coatings 5 and 6 on Table 1. Two rings of each condition were assembled in a 6 cylinders 400 kW heavy duty Diesel engine. The rings were submitted to an accelerated thermal shock test in a dynamometer cell for 500 hours, in conditions identical to example 1. Visual and metallurgical evaluation of the rings after the test was conducted and can be seen on Table 2, test 2.

TABLE 1

Process parameters and Metallurgical evaluation

|  | Samples | Bias voltage (V) | Total Pressure (mbar) | Oxygen doping | Ratio (111)/(200) | Hardness (HV) | Oxygen content (wt %) | Porosity (%) | Cracks or Spalling after test |
|---|---|---|---|---|---|---|---|---|---|
| Prior art | 1 | −15 | $5 \times 10^{-2}$ | No | 0.25 | 1,250 | 0.3 | 2 | Yes |
| Comparative | 2 | −15 | $8 \times 10^{-2}$ | No | 0.33 | 1,200 | 0.5 | 3 | Not Tested |
| Examples | 3 | −15 | $8 \times 10^{-2}$ | Yes | 0.13 | 2,900 | 10.4 | 3.5 | Yes |
| Embodiments | 4 | −18 | $3.4 \times 10^{-2}$ | Yes | 0.85 | 1,650 | 1.2 | 3 | No |
|  | 5 | −18 | $4.8 \times 10^{-2}$ | Yes | 1.03 | 1,700 | 1.3 | 1.5 | No |
|  | 6 | −30 | $5.0 \times 10^{-2}$ | Yes | 0.98 | 1,860 | 2.3 | 3.5 | No |

TABLE 2

Visual and metallurgical evaluation of rings after engine test

| | | Engine Test Assembling position | | Oxygen content | Ratio | crack |
|---|---|---|---|---|---|---|
| Samples | | Test 1 | Test 2 | (%) | (111)/(200) | after test |
| Prior art | 1 | cylinder #1, #3 and #6 | — | 0.3 | 0.25 | yes |
| Comparative Examples | 3 | — | cylinder #1 and #3 | 10.4 | 0.13 | yes |
| Embodiments | 4 | cylinders #2, #4 and #5 | — | 1.2 | 0.85 | no |
| | 5 | — | cylinders #4 and #5 | 1.3 | 1.03 | no |
| | 6 | — | cylinders #2 and #6 | 2.3 | 0.98 | no |

Table 2 also indicates the assembling configuration of the compression rings in the six cylinders of the engine. The cylinder liners as well as the second rings and the oil rings were taken from the same production lots to minimize as much as possible the variables involved.

The rings of coating sample 3 on Table 1 represent the state of the art, as mentioned before.

The rings of coating samples 3, 5 and 6 in Table 1 were produced with the above-mentioned process, wherein it was added a controlled flow of oxygen gas to the nitrogen reacting gas. These coatings were intentionally selected to represent respectively, a chromium nitride coating of the state of the art with predominance of crystal planes (200) parallel to the coating surface and with intensity ratio between crystal planes (111) and (200) of 0.13, and the chromium nitride coatings according to the present invention, with a ratio of planes (111) and (200), represented by an intensity ratio of crystal planes (111) and (200) of 1.03 and a ratio of planes (111) and (200), represented by an intensity ratio of crystal planes (111) and (200) of 0.98, respectively.

The rings of coating sample 3 presented incidence of micro-cracks and localized loss of pieces of the coating after engine test. The rings of coating sample 5 presented absence of micro-cracks, reproducing the result observed on engine test of Example 1. This result makes stronger the importance of having a specific quantity of crystal planes (111) together with crystal planes (200), avoiding predominance of crystal planes (200) as defined in the state of the art.

The results allow to conclude that the most important characteristic influencing the behavior of the chromium nitride coating concerning initiation of micro-cracks is not the oxygen content in the coating, but the crystal structure of it, which must have a similar intensity counting of crystalline planes (111) and (200). The desired crystal structure can only be obtained through a well-defined range of deposition parameters according to the present invention, which leads to a specific range of oxygen content in the coating. This oxygen content together with the deposition parameters are important to build up this expected crystal structure.

It was observed that samples 1 and 3, representative of the state of the art, presented incidence of micro-cracks on the coating and localized loss of pieces of the coating. FIG. 4 shows the running face of a piston ring with a CrN coating of the prior art after heavy duty engine operation with occurrence of cracks and spalling.

On the other hand, samples 4, 5 and 6 according to the present invention showed outstanding results without any incidence of micro-cracks or localized loss of pieces of the coating.

The results demonstrate that the chromium nitride coating described in the present invention has superior properties and contributes for the necessary modern engine requirements.

Although the present invention has been described with reference to the preferred embodiments, it is apparent that the present invention is not limited to the aforesaid preferred embodiments, but various modifications can be attained without departing from its scope.

What is claimed is:

1. A piston ring for internal combustion engines, comprising:
    a steel or cast iron base material; and
    a coating of chromium nitride deposited by a physical vapor deposition process on a sliding surface of the piston ring,
    wherein the coating is composed of a columnar crystal structure of CrN with the following features:
    (a) an oxygen content in solid solution of 0.5 to 2.5 wt %;
    (b) a content of uniformly dispersed micro-pores of less than 10% in volume of the coating; and
    (c) an X-ray diffraction intensity ratio of a balance of (111) planes to (200) planes parallel to the surface in the range of 0.80 to 1.20.

2. A piston ring according to claim 1, wherein the Vickers hardness of the coating is in the range of 1,500 to 2,500 HV.

3. A piston ring according to claim 1, wherein the thickness of the coating is in the range of 5-80 microns.

4. A piston ring according to claim 1, wherein the base material is steel with 10 to 17% of chromium.

5. A piston ring according to claim 4, wherein the steel base material is nitrided.

6. A piston ring according to claim 1, wherein the cast iron base material is nitrided.

7. A piston ring according to claim 1, wherein an intermediate bonding layer of chromium, nickel or cobalt is deposited between the steel or cast iron base material and the coating of chromium nitride.

8. A physical vapor deposition process for manufacturing a coating of chromium nitride wherein a chamber pressure in the range of 2.5 to $5.0 \times 10^{-2}$ mbar, a Bias Voltage in the range of −15 to −50 V, a partial pressure of oxygen in the range of 5.0 to 10.0 $10^{-4}$ mbar are maintained to produce a coating of chromium nitride with an oxygen content for 0.5-2.5 wt % and a X-ray diffraction intensity ratio of (111) planes to (200) planes parallel to the surface in the range of 0.80 to 1.20.

* * * * *